US006363623B1

(12) United States Patent
Abraham

(10) Patent No.: US 6,363,623 B1
(45) Date of Patent: Apr. 2, 2002

(54) APPARATUS AND METHOD FOR SPINNING A WORK PIECE

(75) Inventor: Richard Abraham, Portland, OR (US)

(73) Assignee: SpeedFam-IPEC Corporation, Chandler, AZ (US)

( * ) Notice: Subject to any disclaimer, the term of this patent is extended or adjusted under 35 U.S.C. 154(b) by 0 days.

(21) Appl. No.: 09/586,207

(22) Filed: Jun. 2, 2000

(51) Int. Cl.[7] ................................................. F26B 17/30
(52) U.S. Cl. .............................. 34/58; 34/317; 134/149
(58) Field of Search ............................... 34/58, 60, 61, 34/84, 108, 317; 134/147, 149, 153, 902

(56) References Cited

U.S. PATENT DOCUMENTS

| | | | |
|---|---|---|---|
| 4,651,440 A | | 3/1987 | Karl |
| 5,518,542 A | * | 5/1996 | Matsukawa et al. .......... 118/52 |
| 5,558,110 A | | 9/1996 | Williford, Jr. |
| 5,666,985 A | * | 9/1997 | Smith, Jr. et al. ........... 134/142 |
| 5,775,000 A | | 7/1998 | Maekawa et al. |
| 5,778,554 A | | 7/1998 | Jones |
| 5,829,156 A | | 11/1998 | Shibasaki et al. |
| 5,851,041 A | * | 12/1998 | Anderson et al. ........... 294/106 |
| 5,974,681 A | * | 11/1999 | Gonzalez-Martin et al. ... 34/58 |
| 6,167,893 B1 | * | 1/2001 | Taatjes et al. ............... 134/147 |

* cited by examiner

Primary Examiner—Henry Bennett
Assistant Examiner—Greg T. Warder
(74) Attorney, Agent, or Firm—James L. Farmer

(57) ABSTRACT

Apparatus for spinning a work piece such as a semiconductor wafer includes a work piece platform that is configured to be rotated about a central axis. Arrayed about the periphery of the platform is a plurality of spaced apart, symmetrically positioned work piece supports. Each of the supports includes a resilient bumper that serves both to support the work piece and as a friction brake to retard slippage of the work piece relative to the platform when the platform and work piece are rotating, and especially when the platform is accelerating or decelerating. Also arrayed about the periphery of the work piece platform is a plurality of work piece gripper assemblies configured to center the work piece in contact with the work piece supports when the platform is rotating. The gripper assemblies include a gripper finger that is configured to pivot about a pivot axis from a non work piece gripping position to a work piece gripping position in response to centrifugal force generated by the rotation of the platform. In the work piece gripping position the gripper finger contacts the edge of the work piece.

24 Claims, 7 Drawing Sheets

APPARATUS AND METHOD FOR SPINNING A WORK PIECE

TECHNICAL FIELD

This invention relates generally to an apparatus and to a method for processing a work piece such as a semiconductor wafer, and more specifically to an apparatus and a method for spinning a work piece such as for spin drying the work piece as a part of a manufacturing process.

BACKGROUND OF THE INVENTION

This invention relates to the processing of objects that are generally in the shape of flat, circular disks. Such objects include, for example, semiconductor wafers, compact disks, memory disks, optical blanks, and the like. Without loss of generality, such objects will be referred to as "work pieces." Illustrative examples will refer specifically to the use of this invention in connection with the processing of semiconductor wafers, but such examples are presented merely to aid in understanding, and are not intended to limit in any way the generality of the invention.

During the fabrication of a work piece, the work piece may be subjected to various processing steps. In the case of fabricating a semiconductor wafer, those process steps may involve the growth or deposition of insulating layers, the deposition of metal or other conductive layers, impurity doping, photolithographic patterning, planarization, and the like. The fabrication of such semiconductor wafers requires extreme cleanliness of the wafer at various stages of the process. Accordingly, the above process steps are often preceded or followed by cleaning steps to insure that the requisite cleanliness of the wafer is maintained. The cleaning steps may involve, for example, steps such as scrubbing, spray cleaning, rinsing and the like. At the completion of the cleaning steps, the wafer is usually processed to remove any water or other cleaning agents during the cleaning operation. Such removal is necessary to prepare the wafer for the next process step and to prevent the water or cleaning agent from drying on the wafer surface and leaving a contaminating residue.

Spin drying is a process commonly used to remove liquid residue from the surface of a work piece. In such a process the work piece is spun about its axis at a high rotational velocity so that centrifugal force drives droplets of the liquid radially outward and off the work piece surface. Spin drying is accomplished by placing the work piece on a platform that is coupled to a drive motor. The drive motor causes the platform to spin at a velocity, for example, on the order of 1000–4000 rpm. The work piece must by properly positioned on the platform to insure that the work piece is not thrown from the platform during the spinning. The positioning, however, should be such that a minimum of the work piece surface is covered or touched by the positioning mechanism because the spin drying may be ineffective with respect to the covered or touched areas. In addition, the area touched by the positioning mechanism should be minimized because any clamping or other touching of the sensitive surface of the work piece may damage that surface. With semiconductor wafers, for example, the usual rule of thumb is that no clamp or other mechanism can touch any part of the wafer surface more than 3 mm beyond the edge of the wafer. Especially when using such minimal touching, care must be exercised to insure that the work piece is properly positioned before the spinning mechanism is engaged. Spinning a work piece that is misaligned may cause work piece breakage.

As the processing of work pieces becomes ever more exacting, the need for better and better cleaning processes becomes more important. For example, in the semiconductor industry, the size of the features of a semiconductor device is shrinking with every new generation of devices. At the same time, the spacing between devices is shrinking. With smaller features and closer spacing, wafer cleanliness becomes of supreme importance. Even tiny particles or contaminates can adversely affect device performance or can even cause device failure. In addition to the necessity of producing a clean, contamination free product, however, it is highly desired that the cleaning and drying processes should be fast and efficient. Preferably such process should be highly automated. Although spin drying is now widely practiced in the processing of work pieces such as semiconductor wafers, the presently available apparatus and processes are somewhat lacking in providing a highly automated, efficient cleaning with minimal but reliable contacting of the work piece surface.

Accordingly, a need exists for a work piece spinning apparatus and method that overcomes the deficiencies attendant with present apparatus and its use. Although such apparatus is particularly applicable for spinning a work piece in a spin drying process, the apparatus can also find application in other work piece spinning processes such as the spin application of a process chemical to the surface of the work piece or the spin rinsing of the work piece surface.

BRIEF DESCRIPTION OF THE DRAWING FIGURES

The present invention will be described herein in conjunction with the appended drawing figures in which like numerals denote like elements, and:

DETAILED DESCRIPTION OF PREFERRED EXEMPLARY EMBODIMENTS

The following describes apparatus, and processes for use of that apparatus for spinning a work piece such as a semiconductor wafer in accordance with various embodiments of the invention,. The apparatus and process, however, are generally applicable to the spinning of any substantially planar, disk shaped objects.

Figure 1:
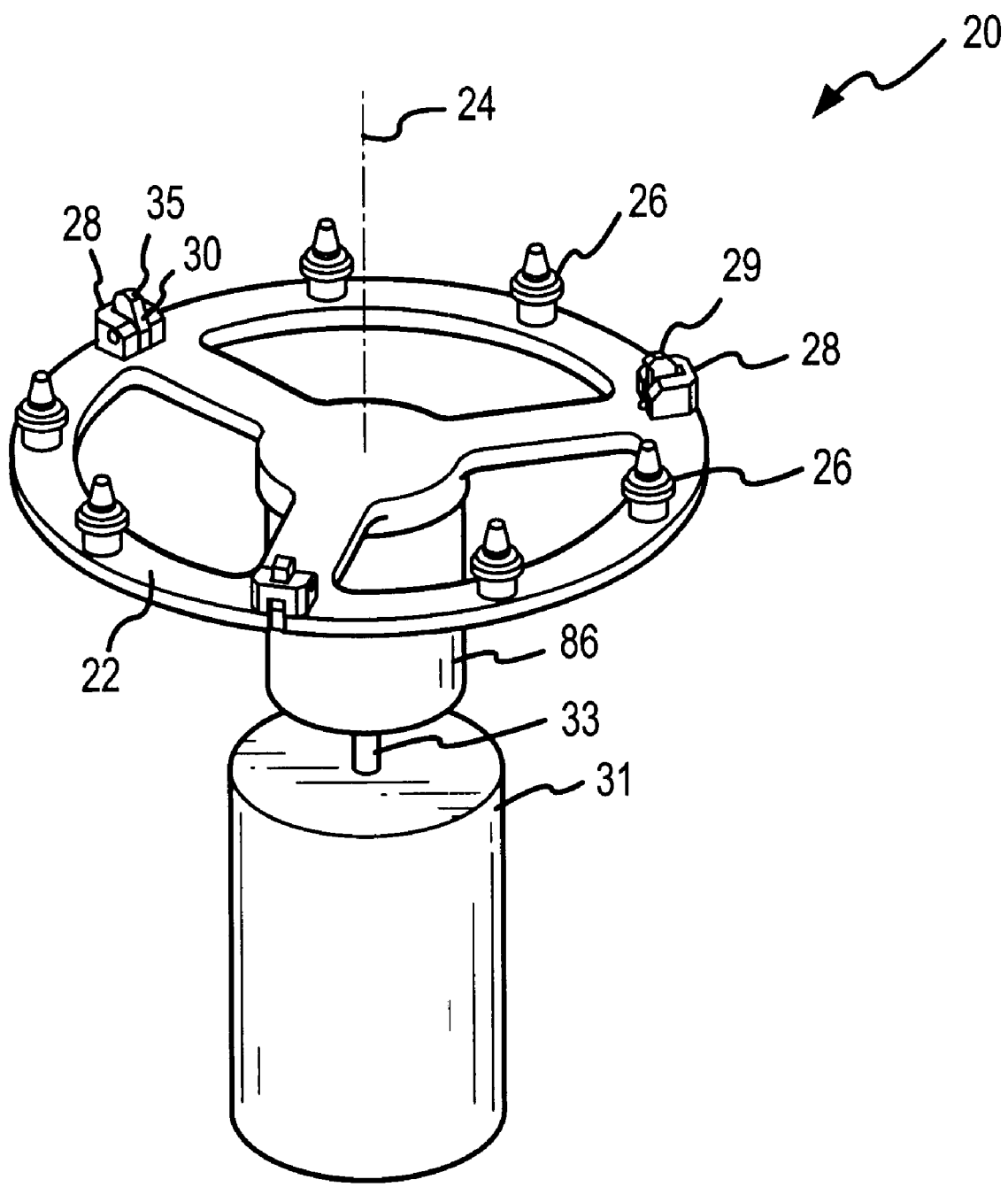
FIGS. 1 and 2 illustrate, in perspective and exploded views, respectively, a work piece spinning apparatus in accordance with one embodiment of the invention.
Figure 2:
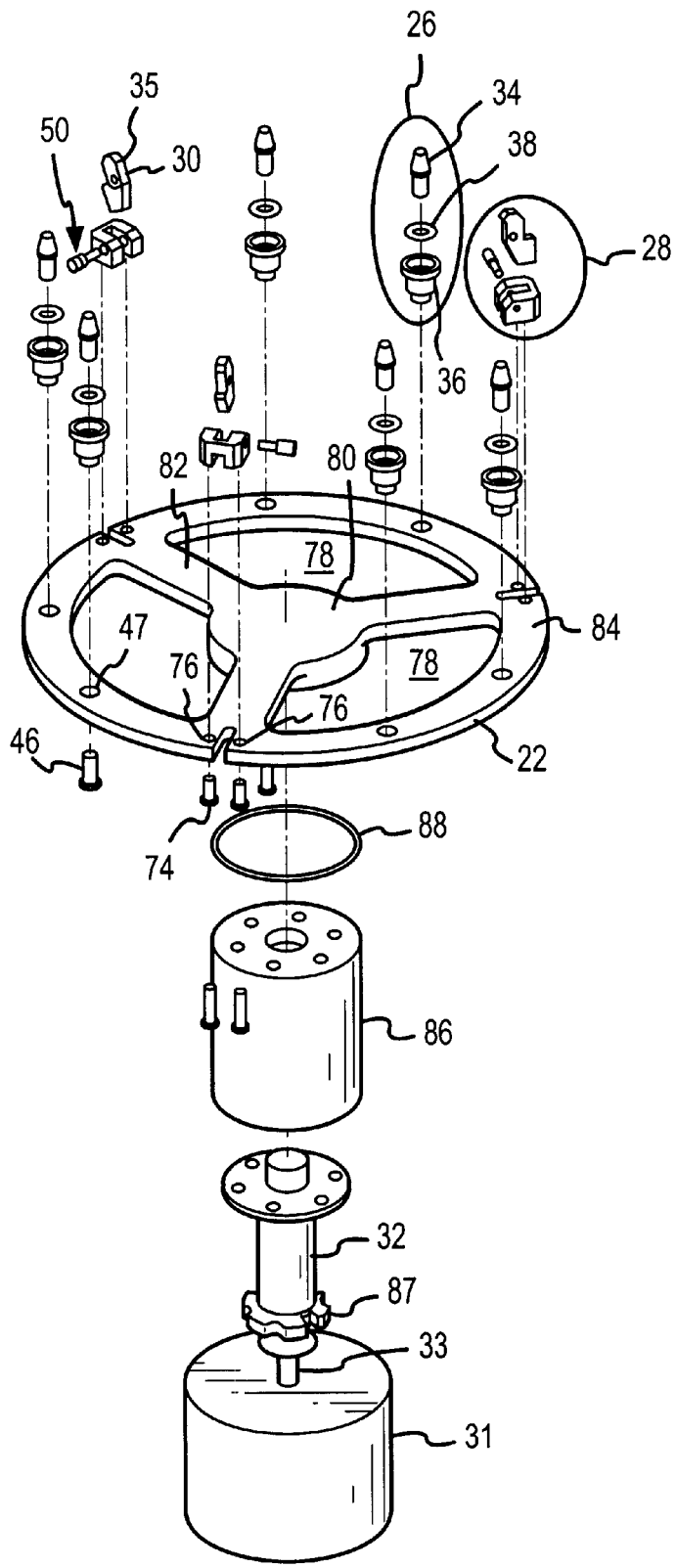

FIG. 1 illustrates, in perspective view, one embodiment of an apparatus 20 for spinning a work piece such as a semiconductor wafer; and FIG. 2 illustrates the same apparatus in an exploded view. Apparatus 20, in accordance with this embodiment, includes a work piece platform 22 that can be made to rotate about an axis 24. Arrayed about the periphery of platform 22 is a plurality of work piece support posts 26. Also arrayed about the periphery of platform 22 is a plurality of work piece gripper assemblies 28. Support posts 26 and gripper assemblies 28 are described in more detail below.

A work piece (not shown in this illustration) is supported and initially aligned by the support posts. Initially gripper fingers 29, associated with gripper assemblies 28 are in a non gripping position. After the work piece is supported on the support posts, platform 22 is started in rotation by a drive motor 31 that is coupled to the underside of platform 22 by a hub shaft 32 and a drive motor shaft 33. As the platform accelerates, gripper fingers 29 pivot about a pivot point in response to the centrifugal force caused by the rotation. As the gripper fingers pivot to a gripping position, an extremity 30 of each of the gripper fingers comes into contact with the outer edge of the work piece. The combination of the plurality of fingers contacting the edge of the work piece about its periphery serve to aid in precisely centering the work piece about axis 24 as it rests on support posts 26. The greater the rotational velocity of the support platform and the work piece, the greater the tendency to center the work piece. In addition, as the work piece is rotated and the gripper finger assumes the gripping position, in one embodiment a beak-like projection 35 on extremity 30 is position in close proximity to but above the surface of the work piece. The beak-like projection, in this embodiment, serves to limit the maximum vertical movement of the work piece. In normal operation of the work piece spinning apparatus the work piece remains securely resting on the plurality of support posts. Beak-like projections 35 insure that the work piece cannot be forcibly thrown upward from the apparatus and thereby destroyed. In the event the work piece does rise from the support posts and contacts projections 35, those projections are configured so that no more than the permissible outer extremity (3 mm in the case of a semiconductor wafer) of the work piece surface is contacted. Upon completion of the spinning process, such as when the work piece surface has been adequately dried, and preferably when the work piece surface has been completely dried, motor 31 is slowed and then stopped to cause the rotation of platform 22 and the work piece supported thereon to be slowed and then stopped. As platform 22 slows and then stops rotating, gripper fingers 29, no longer acted upon by the centrifugal force caused by the platform rotation, pivot back to a non work piece gripping position. With the grippers no longer engaging the edge of the work piece, the work piece can be removed from the apparatus.

Figure 3:
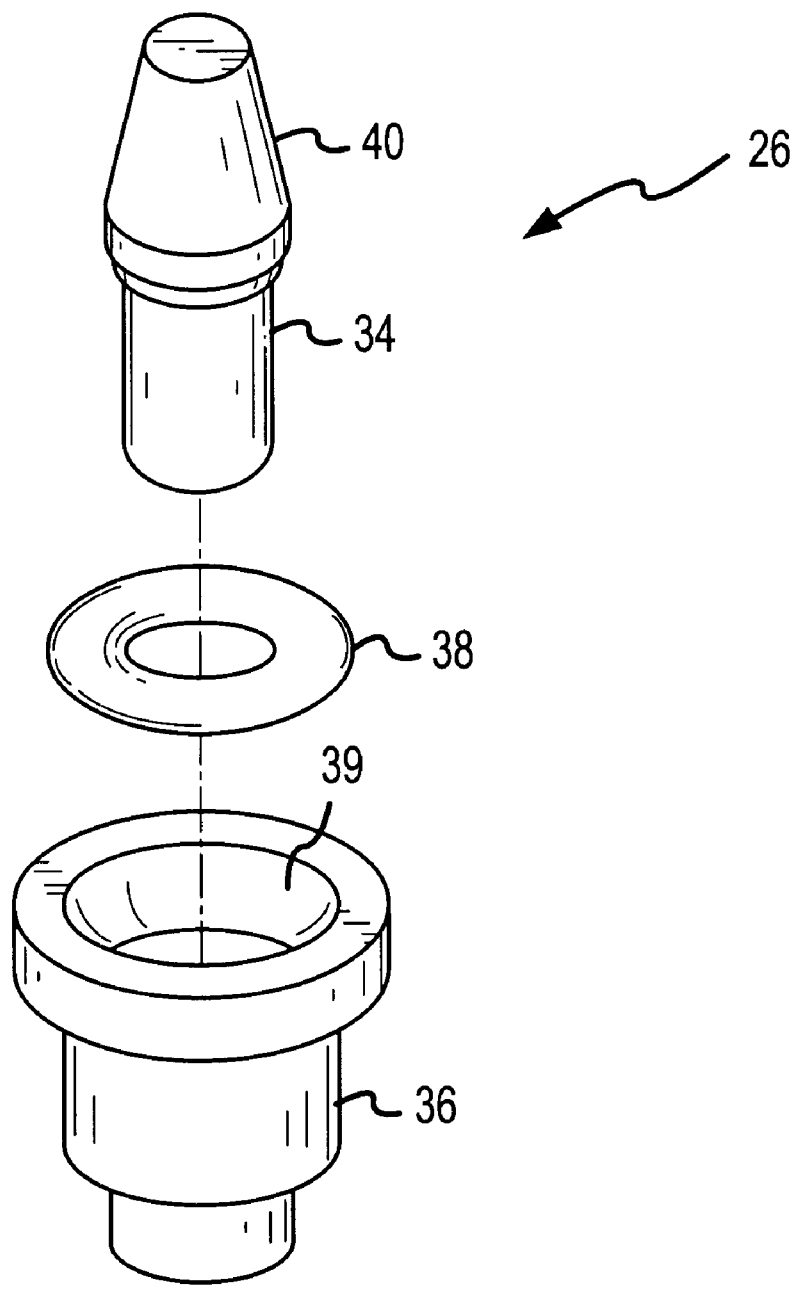
FIGS. 3 and 4 illustrates, in exploded and cross sectional views, respectively, one embodiment of a work piece support post.
Figure 4:
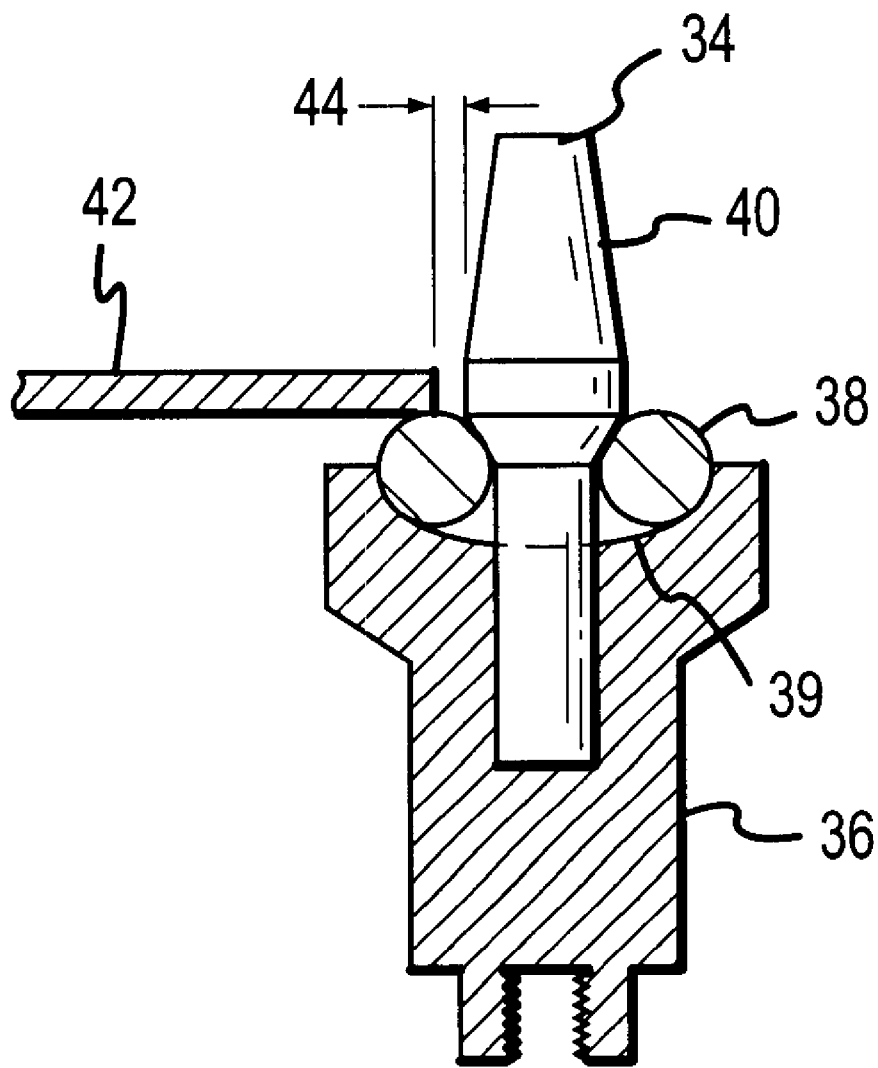

FIGS. 3 and 4 illustrate, in exploded perspective and cross sectional views, respectively, one embodiment of support post 26 in greater detail. Preferably six such support posts are arrayed in a symmetrical arrangement about the periphery of the work piece platform. A greater or lesser number of support posts can be used if desired. In accordance with this illustrative embodiment of the invention, support post 26 includes a central post 34, a collar 36, and an O-ring 38. The tapered upper portion 40 of central post 34 aids in guiding a work piece into proper alignment as it is placed on the apparatus. O-ring 38 fits into the recess 39 in collar 36. Central post 34 is positioned through the interior diameter of the O-ring. O-ring 38, in one embodiment, protrudes above the upper surface of collar 36 by about 0.3–0.7 mm and preferably by about 0.5 mm to provide a resilient supporting surface or bumper upon which the work piece that is to be spun on apparatus 20 is supported. In this embodiment, about 40–70 percent and preferably about 60 percent of the diameter of O-ring 38 protrudes beyond the outer edge of central post 34. FIG. 4 illustrates the positioning of a work piece 42 on O-ring 38. In accordance with one embodiment of the invention, support posts 26 are positioned about the periphery of platform 22 to provide about 0.5–1.5 mm and preferably about 0.8 mm spacing 44 between the edge of work piece 42 and central post 34. That is, the support posts are positioned on a circle having a circumference about 1.0–3.0 mm greater than the expected diameter of the of the work piece. The size and exposed surface of the O-ring and the positioning of the support posts is designed to minimize the amount of work piece surface area that is contacted by the O-ring support bumper. In accordance with one embodiment of the invention, no more than about 3 mm at the outer periphery of the work piece and preferably no more than about 2 mm of the outer periphery of the work piece is contacted by the O-ring portion of the support posts. Preferably the support posts have a height to support the work piece about 10–15 mm and most preferably about 13.5 mm above the surface of platform 22. The spacing allows air to pass around the work piece and aids in the removal of water vapor and any remaining volatile contaminants from the surface of the work piece and in the drying of the work piece.

In accordance with one embodiment of the invention, O-ring 38 serves to support a work piece on support platform 22 and also serves as a friction brake to retard rotational slippage of the work piece during acceleration, rotation, and deceleration of the support platform. That is, O-ring 38 helps to maintain the work piece relatively stationary with respect to the rotating support platform. In doing so, the friction braking action minimizes the rubbing of the bottom surface of the work piece by the O-rings of the support posts and the rubbing of the edge of the work piece by the work piece grippers, thus minimizing potential damage to the wafer.

As illustrated, support post 26 is formed in three parts. The support post can also be formed in other alternate configurations (not illustrated). For example, the support post can be formed in two parts, with the central post and the collar formed as a unitary piece with an O-ring positioned surrounding the unitary piece and fitting into a recess formed in the unitary piece. In further alternative embodiments, other support and frictional brake configurations can be envisioned by those of skill in the art as an alternative to the use of the O-ring. For example, a ledger of material similar to the O-ring material can be attached to a side of the support post with a screw or other fastening device. The entire support post could also be formed of a material similar to the O-ring material.

The support post can be attached to work piece platform 22 by a screw 46 or other fastener that passes through a hole 47 formed in the platform. Additional support is achieved if the hole is configured to accommodate the base of collar 36 as well as the fastener. Alternatively the bottom of the support post could be threaded and could be screwed into mating threads formed in platform 22.

Figure 5:
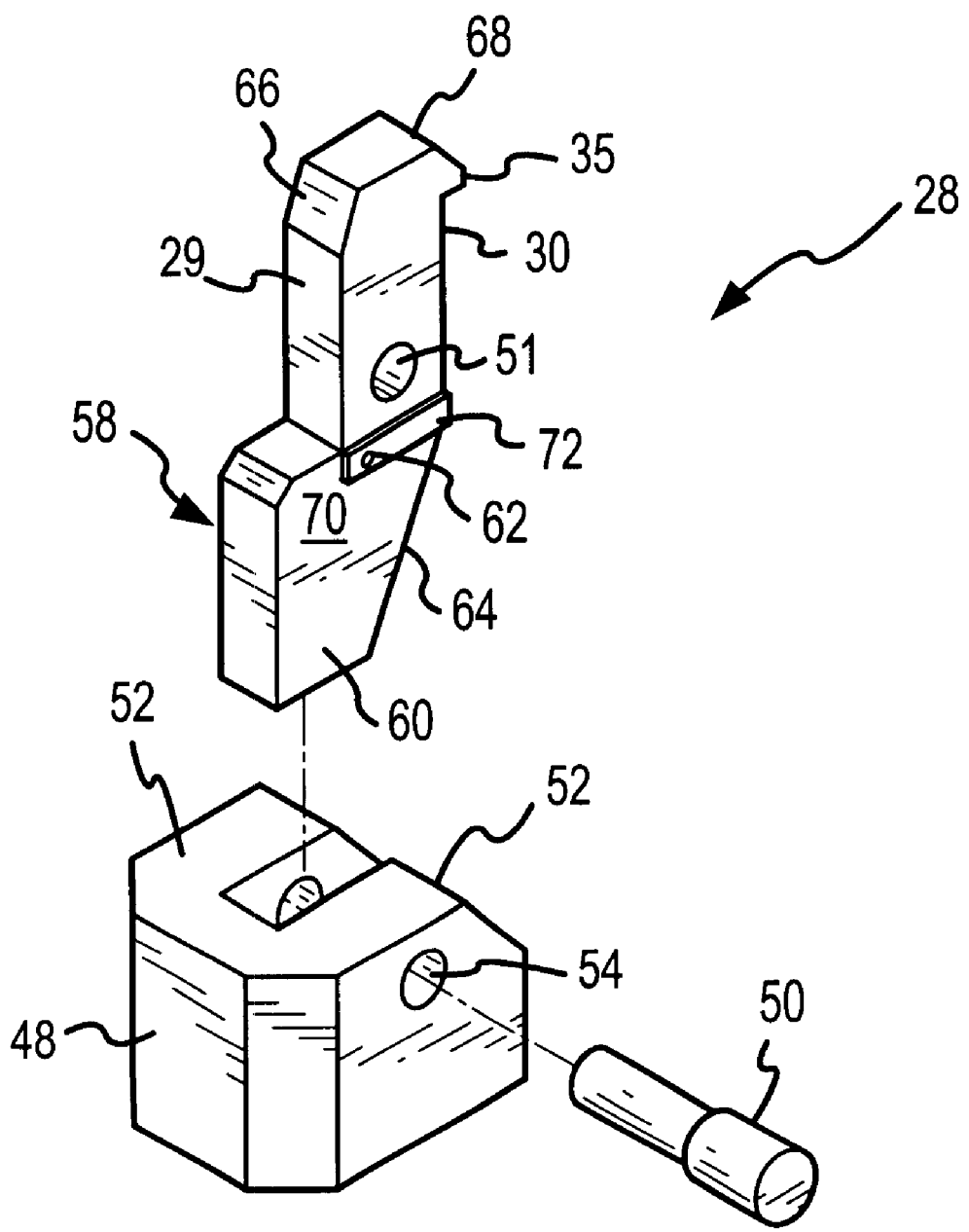
FIG. 5 illustrates, in exploded perspective view, a gripper assembly in accordance with one embodiment of the invention.

FIG. 5 illustrates, in exploded perspective view, a gripper assembly 28 in accordance with one embodiment of the invention. The gripper assembly, in accordance with this embodiment of the invention, includes a gripper finger 29, a finger mount 48, and a finger mount pivot pin 50 that passes through a hole 51 in gripper finger 29. Preferably three such finger mount assemblies are arrayed, equally spaced, about the periphery of work piece platform 22, although more than three assemblies can by deployed if desired.

Figure 6:
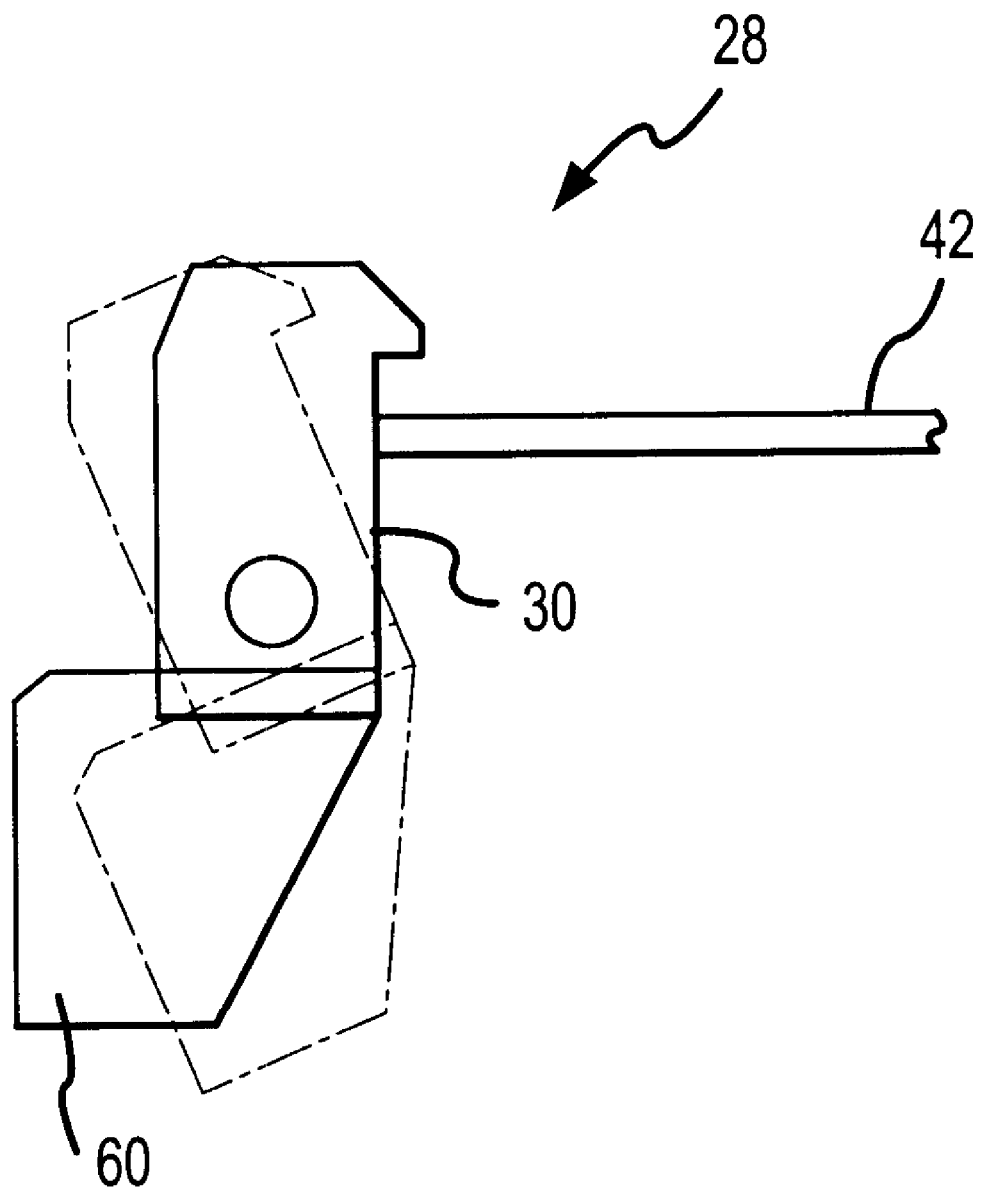
FIG. 6 illustrates, in side view, the two extreme positions of a gripper finger of the gripper assembly illustrated in FIG. 5.

Gripper finger 29 is configured to pivot freely about pivot pin 50 between projections 52 that extend outwardly from finger mount 48. The projections provide a mounting hole 54 through which the pivot pin passes. Although it is preferred to have the pivot pin fixed relative to the projections of the finger mount and to have the gripper finger configured to rotate about the pivot pin, those of skill in the art will recognize that the gripper finger could be fixed relative to the pivot pin and the pivot pin could rotate in hole 54. In either case, the gripper finger is capable of pivoting about a pivot point or axis through the pivot pin. The pivoting of gripper finger 29 is illustrated in FIG. 6. The gripper finger in the work piece gripping position is illustrated in solid lines while the gripper finger in the non work piece gripping position is illustrated in dashed lines.

In the work piece gripping position extremity 30 contacts the edge of the work piece. Collectively the gripper fingers from the three gripper assemblies urge the work piece to a position that is symmetrical with respect to axis 24. In one embodiment of the invention gripper finger 29 is configured to have a beak-like projection 35 at the end of extremity 30. While extremity 30 makes contact with the edge of a work piece 42 when the gripper finger pivots to the work piece gripping position, beak-like projection 35 is positioned in proximity to but above the upper surface of the work piece. Preferably the beak-like projection is positioned about 0.5 mm above the surface of the work piece. Projection 35 is so positioned to prevent the work piece from moving upwardly away from contact with the O-rings of support posts 26 by more than the 0.5 mm spacing. Other spacings could, of course, be implemented. The opposite extremity 58 of gripper finger is configured to provide a counter weight 60. Extremity 30 and counter weight 60 are configured to place the center of gravity of gripper finger 29 at a position 62 offset from the location of hole 51. Position 62 of the center of gravity is offset from the pivot point in a direction away from axis 24 about which work piece platform 22 rotates and toward the plane of the platform. In accordance with one embodiment, opposite extremity 58 of gripper finger 29 is shaped, for example by beveling edge 64, in a manner to aid in correctly positioning the center of gravity. Edges 66 and 68 are also beveled to minimize the horizontal surfaces upon which water, cleaning liquids, or other contaminants can accumulate.

Gripper finger 29 is preferably formed having a planar side surface 70 with a raised portion 72 of limited area projecting outwardly from the planar surface. Raised portion 72 provides a bearing surface of limited areal extent that contacts the inner surfaces of projections 52. Making the raised portions of limited areal extent reduces the friction between the gripper finger and the finger mount and thus reduces the amount of force needed to cause the gripper finger to pivot about the pivot pin. When work piece platform 22 is stationary, the gripper finger is in the non work piece gripping position. With the gripper thus retracted, a work piece can be loaded into the apparatus with the work piece resting on the O-rings of the plurality of support posts. As the work piece platform begins to rotate about axis 24, the positioning of the center of gravity in a location offset from the pivot axis causes the gripper fingers to pivot about their pivot points to a work piece gripping position with extremity 30 contacting the edge of the work piece and beak-like projection 35 positioned above the edge of the upper surface of the work piece.

The gripper assemblies can be attached to the work piece platform by screws 74 or other fastening devices that project through holes 76 in the work piece platform and engage the finger mounts. In accordance with a preferred embodiment of the invention, one of the mounting screws can be used to also engage, and thereby lock in place, finger mount pivot pin 50.

The gripper finger and the gripper assembly are configured and positioned so that extremity 30 of the gripper finger contacts only the edge of the work piece. The O-rings of the support posts contact only the outer 3 mm or less at the edge of the lower surface of the work piece. By minimizing the contact of the work piece by the gripper fingers and the support posts, the surface areas that cannot be completely rinsed and dried or otherwise processed are minimized.

Referring again to FIGS. 1 and 2, platform 22 is generally a flat, circular disk having a plurality of symmetrically disposed openings 78. The openings reduce the mass of the platform, reducing the size of the motor necessary to rotate the platform. The openings also provide a pathway for the flow of air used to remove water vapor and any volatile contaminants and to aid in the drying process. As illustrated, the platform can have the shape of a hub 80 with a plurality of radial spokes 82 supporting a circular outer rim 84. Hub shaft 32 can be attached to the bottom of hub 80 by a plurality of screws or other fasteners. The lower end 87 of hub shaft 32 can be configured to engage drive motor shaft 33 that, in turn, is coupled to drive motor 31.

Because there may be residual chemicals on the work pieces and some of those chemicals may be highly reactive, it is advantageous that the various components of apparatus 20 be of chemically resistant materials or otherwise be protected from the residual chemicals. Hub shaft 32 is preferably a metal such as stainless steel. Preferably the shaft is a hollow cylinder lined with a chemically resistant plastic material. To protect the shaft from chemical attack, a labyrinthian shield 86 can be positioned about the shaft. Shield 86 can have an inverted cup shape and can be attached to the hub of platform 22 with the same fasteners that attach hub shaft 32 to the hub. An O-ring 88 forms a seal between the shield and the hub. The open lower end of shield 86 allows air, nitrogen, or other purging gas to flow through and around the apparatus to ventilate the area between the shaft skirt and the shield to remove any undesirable vapors. Alternatively, as will be apparent to those of skill in the art, the motor shaft and all components coupling the motor to platform 22 could be coated with a chemically resistant material such as teflon. The work piece platform, work piece grippers, work piece support posts, including the central post, collar, and O-ring, and the shield are preferably made of a chemically resistant material. Preferably all parts that may be wetted by the rinsing agent, to be removed from the work piece, are made from a chemically resistant material. In addition to being chemically resistant, preferably these parts are made from a material that is also dimensionally stable. The central posts and gripper fingers and finger mounts are preferably formed from a material that is also wear resistant because of possible abrasion from contact with the work pieces. Silicon is a very hard material, and if the work pieces are silicon wafers, for example, parts of the apparatus that come into contact with the wafers are subject to wear. The O-ring that forms the supporting surface of the work piece support post and acts as a friction brake is preferably formed of a material having a high purity because it is in contact with the work piece; it should also have a high coefficient of friction. The O-ring can be formed, for example, from a pure elastomer, and preferably is formed from a pure perfluorinated elastomer such as Chemraz, a material available from Greene, Tweed & Co., Kulpsville, Pa. In accordance with one embodiment of the invention, the work piece platform and shield can be formed of polyethylene terephtalate. (PET), and the gripper fingers, finger mounts, pivot pins, support posts, collar and wetted fasteners can be formed of polyetheretherketone (PEEK).

Apparatus 20 illustrated in FIGS. 1 and 2 may also include one or more sensors (not illustrated) that indicate the presence of a work piece positioned on the apparatus. The presence sensors can be, for example, optical sensors or capacitive sensors. The sensors indicate the presence of a work piece and provide a signal to a controller (not shown) to initiate the rotation of work piece platform 22. The controller, or multiple controllers can be used, in known manner, to initiate, control, and terminate all of the functions of the apparatus in the proper sequence. Such controller can be any suitable microprocessor, microcontroller, or computer controller as will be apparent to those of skill in the equipment control art.

Figure 7:
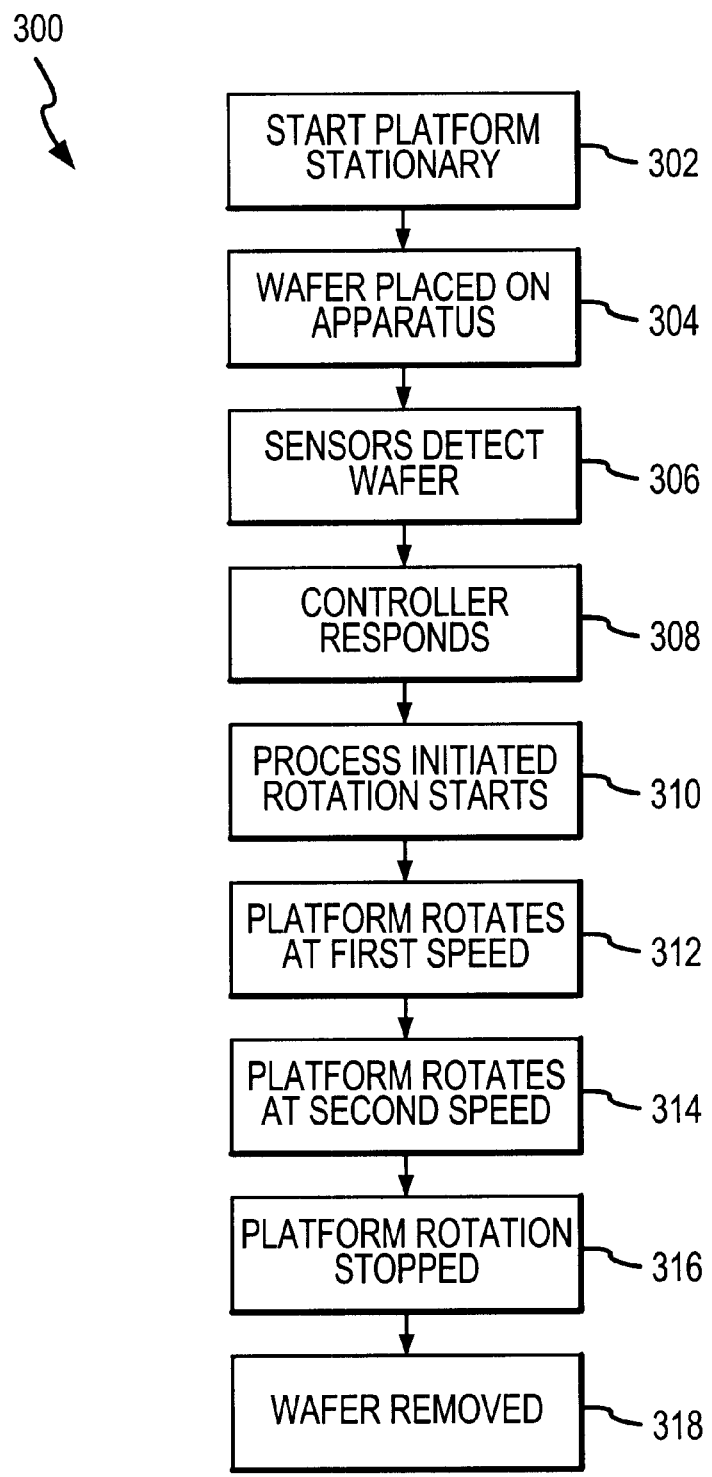
FIG. 7 illustrates in flow chart form, one process for spinning a work piece in accordance with an embodiment of the invention.

FIG. 7 illustrates, in flow chart form, a process 300 for spinning a work piece in accordance with an embodiment of the invention. As a specific but non-limiting illustrative example, process 300 describes a spin drying process for use with a semiconductor wafer following a clean and rinse process. Such a process might occur, for example, after the semiconductor wafer has been planarized in a chemical-mechanical planarization (CMP) process. Following the CMP process, the wafer would be subjected to a cleaning process that might include scrubbing in the presence of dilute acids, bases, or other cleaning agents to remove any residue, contaminants, and particulates from the CMP process. This cleaning would be followed by a water or other chemical rinse. Even after such a rinse, some residue of the cleaning agents might remain on the wafer, and it is because of these residues that the exposed components of the spinning apparatus should be fabricated from chemically resistant materials. Some of these chemical cleaning agents may even be introduced as an initial step in the spin drying process. The spin drying process, as a result of the centrifugal force and the air circulation relative to the wafer surface, is intended to remove any water or other rinsing agents from the surfaces of the wafer. Such removal avoids any contaminants from the cleaning or rinsing process from drying on the wafer surfaces and leaving a residue.

Process 300 starts at step 302 with work piece platform 22 of work piece spinning apparatus 20 stationary and the work piece gripper assemblies 28 in the non gripping position.

In step 304 a semiconductor wafer is placed on the apparatus in alignment with support posts 26. The tapered upper surfaces of central posts 34 help to properly center the wafer on the apparatus. The wafer can be placed on the apparatus by hand, or, preferably, by a robotic manipulator as part of an automated process. Properly positioned, the wafer is supported by O-ring bumpers 38 surrounding the central posts.

In step 306 wafer presence sensors detect the presence of a wafer on the support posts. In an apparatus using robotic loading such sensors may not be necessary as the robot itself can detect and report the wafer presence. Such sensors also may not be necessary when the process is not automated, as the operator loading the wafer can observe the proper placement and initiate the remaining process steps. When a sensor is used, the sensor transmits a signal responsive to the sensed wafer to a controller that interprets the received signals to indicate the presence of a wafer.

In step 308 the controller responds to the received signals. If the signals sent from the sensors are interpreted to indicate that the wafer is not properly aligned on the support posts, the controller issues an alert signal to indicate a misalignment problem. If the controller interprets the received signals to indicate that the wafer is present and properly aligned on the support posts, the controller initiates the spin drying process.

In step 310 the spin drying process is initiated. The controller causes motor 31 to initiate rotation of the work piece platform.

In step 312, in accordance with one embodiment of the invention, the platform accelerates to a first rotational speed of about 1000 rpm and maintains this rotational speed for a period of about 5–10 seconds. As the platform begins to accelerate to this first rotational speed, gripper fingers 29, acted upon by the centrifugal force generated by the platform rotation, rotate about finger mount pivot pins 50 to a work piece gripping position. The extremity of each gripper finger contacts the edge of the wafer, pushing inwardly toward axis 24 and begins to center the wafer as it rests on the O-ring bumpers. During the time the platform is maintained at this first rotational speed, a spray arm (not illustrated) may be used to rinse the surface of the wafer with a spray of water or other rinsing agent.

After the completion of the rinsing step or at the completion of the rotation at the first rotational speed, in step 314 the controller causes the drive motor to increase the rotational speed of the work piece platform to a rotational speed of about 3500 rpm. This rotational speed is maintained for a period of about 30–60 seconds, and preferably for a period of 45 seconds. During step 314 any water or other liquids are removed from the wafer surfaces by centrifugal force and by the relative motion of air across the wafer surface. The relative motion of air across the wafer surface can result from the spinning of the wafer and by the optional additional flow of air or a drying gas blown onto the wafer surface. An observer watching the wafer as it spins in steps 312 and 314 is able to observe the centering action of the gripper fingers. The edge of the wafer at first appears indistinct as the slightly misaligned wafer spins eccentrically. The edge of the wafer becomes more distinct as the centering action continues. At a rotational speed of about 2000 rpm the wafer edge usually appears distinct, indicating that the wafer is properly centered relative to the axis of rotation.

In step 316 the controller causes the drive motor to slow and brings the work piece platform and the work piece to a stop. When the work piece platform stops rotating, the gripper fingers of the work piece gripper assemblies pivot about the finger mount pivot pins to a non work piece gripping position.

In step 318 the dried wafer can then be removed from the work piece spinning apparatus, either manually or by a robotic manipulator.

During the steps when the work piece platform and the wafer mounted thereon are being accelerated, rotated, and decelerated, the O-ring bumpers act as a frictional brake to retard the slippage of the wafer with respect to the work piece platform. Retarding slippage minimizes damage that might occur to the wafer. In addition, retarding any slippage, reduces wear on the O-rings, center posts, and gripper fingers.

Thus it is apparent that there has been provided, in accordance with the invention, a work piece spinning apparatus and process for spinning a work piece that fully meets the needs set forth above. Although the invention has been illustrated and described with reference to various embodiments thereof, it is not intended that the invention be limited to these illustrative embodiments. Those of skill in the art will recognize that variations and modifications can be made to the apparatus and/or to the process without departing from the spirit of the invention. For example, the apparatus can be made from other materials, different numbers of components can be employed and different techniques can be used to fasten components to the work piece platform. The work piece spinning apparatus can be employed in processes other than for drying a work piece, and can be used for work pieces other than semiconductor wafers. In the process for spinning a work piece, different rotational speeds and spin times can be used consistent with the objectives of the process. Accordingly, it is intended to encompass within the invention all such variations and modifications as fall within the scope of the appended claims.

What is claimed is:

1. Apparatus for spinning a work piece comprising:
   a work piece platform capable of rotating in a plane about an axis;
   a drive motor coupled to the platform and capable of causing the platform to rotate about the axis;
   a plurality of work piece grippers positioned about the periphery of the platform, each of the grippers comprising a gripper finger capable of pivoting about a pivot axis from a non work piece gripping position, if the platform is stationary, to a work piece gripping position in response to rotation of the platform; and
   a plurality of work piece support posts positioned about the periphery of the platform, each of the support posts comprising a solid post of a first material having a tapered upper extremity, and a protrusion of a second material for supporting a workpiece positioned about the solid post, wherein the second material is an elastomeric material with a high friction coefficient.

2. The apparatus of claim 1 wherein each of the work piece grippers comprises:
   a gripper finger mount attached to the work piece platform; and
   a gripper finger mount pin engaged with the gripper finger mount and providing the pivot axis about which the gripper finger is capable of pivoting.

3. The apparatus of claim 2 wherein the gripper finger comprises a chemically resistant material having a hole therethrough and the gripper finger mount pin passes through the hole.

4. The apparatus of claim 3 wherein the gripper finger is configured to have a center of gravity offset from the hole through which the gripper finger mount pin passes to cause the gripper finger to rotate to the non work piece gripping position when the platform is stationary and to rotate to the work piece gripping position when the platform is rotating.

5. The apparatus of claim 4 wherein the center of gravity of the gripper finger is offset from the hole through which the gripper finger mount pin passes in the direction away from the axis and toward the plane of the platform.

6. The apparatus of claim 4 wherein the gripper finger is configured to have a projection, configured and positioned to prevent the work piece from moving upwardly, at one extremity and a counter weight at the opposite extremity.

7. The apparatus of claim 3 wherein the gripper finger mount comprises two projections, the gripper finger mount pin extends between the two projections, and the gripper finger is confined between the two projections.

8. The apparatus of claim 7 wherein the gripper finger comprises a raised portion on an edge thereof to provide a bearing surface of limited area to reduce friction between the gripper finger and the projections.

9. The apparatus of claim 1 wherein the friction brake comprises a resilient bumper.

10. The apparatus of claim 9 wherein the resilient bumper comprises an O-ring formed of a pure elastomeric material.

11. The apparatus of claim 10 wherein the bumper is formed of a perfluorinated elastomeric material.

12. The apparatus of claim 10 wherein each of the work piece support posts comprises a solid central post having a tapered upper surface and the O-ring is positioned around the solid post.

13. The apparatus of claim 1 wherein the work piece platform comprises a substantially planar disk of chemically resistant material having a plurality of symmetrically positioned openings formed therethrough.

14. The apparatus of claim 1 further comprising a work piece presence sensor positioned to detect the presence of a work piece on the work piece support posts.

15. The apparatus of claim 14 wherein the work piece presence sensor comprises a sensor capable of outputting a signal responsive to the presence of a work piece.

16. An apparatus for spinning a work piece comprising:
   a work piece platform capable of rotating in a plane about an axis;
   a plurality of work piece support posts positioned about the periphery of the work piece platform, each of the support posts comprising a solid post having a tapered upper extremity and an elastomeric protrusion from the solid post of a first material having a tapered upper extremity, and a protrusion of second material for supporting a workpiece positioned about the solid post, wherein the second material is an elastomeric material with a high friction coefficient;
   a plurality of work piece grippers positioned about the periphery of the work piece platform, each of the grippers comprising a gripping finger mounted to pivot into a work piece gripping position in response to rotation of the work piece platform;
   a work piece presence sensor capable of detecting the presence of a work piece and of generating a signal responsive to the presence; and
   a controller coupled to receive the signal and capable of causing the work piece platform to rotate in response to the signal.

17. The apparatus of claim 16 wherein the gripping finger comprises:
   a body having a work piece contacting surface at one extremity and a counter weight at an opposite extremity; and
   a hole through the body to accommodate a pivot pin about which the body can pivot, the hole offset from the center of gravity of the body.

18. An apparatus for spinning a work piece comprising:
   a work piece platform capable of rotating in a plane about an axis;
   a plurality of work piece support posts positioned about the periphery of the work piece platform, each of the support posts comprising a solid post having a tapered upper extremity and an elastomeric protrusion from the solid post, wherein the elastomeric protrusion comprises an O-ring positioned about the solid post;
   a plurality of work piece grippers positioned about the periphery of the work piece platform, each of the grippers comprising a gripping finger mounted to pivot into a work piece gripping position in response to rotation of the work piece platform;
   a work piece presence sensor capable of detecting the presence of a work piece and of generating a signal responsive to the presence; and
   a controller coupled to receive the signal and capable of causing the work piece platform to rotate in response to the signal.

19. The apparatus of claim 16 wherein the work piece platform, the solid posts and the work piece grippers all comprise a chemically resistant, dimensionally stable material.

20. An apparatus for spinning a work piece comprising:
   a work piece platform capable of rotating in a plane about an axis;
   a drive motor coupled to the platform and capable of causing the platform to rotate about the axis;
   a plurality of support posts positioned about the periphery of the work piece platform, each of the support posts comprising a solid post of a first material having a tapered upper extremity, and a protrusion of a second material for supporting a workpiece positioned about the solid post, wherein the second material is an elastomeric material with a high friction coefficient; and
   a plurality of work piece grippers positioned about the periphery of the work piece platform, each of the grippers comprising:
      a gripper mounting block secured to the work piece platform;
      a work piece gripper finger having a hole therethrough and configured to have a contacting surface at one extremity for contacting an edge of a work piece and a counter weight at an opposite extremity, the center of gravity of the gripper finger offset from the hole;
      a pivot pin passing through a portion of the gripper mounting block and through the hole in the gripper finger and providing an axis about which the gripper finger can pivot.

21. A method for spinning a work piece comprising the steps of:
   positioning a work piece on a plurality of support posts arrayed about the periphery of a work piece platform, each of said support posts comprising a solid post of a first material having a tapered upper extremity, and a protrusion of a second material for supporting a workpiece positioned about the solid post, wherein the second material is an elastomeric material with a high friction coefficient;
   initiating rotation of the work piece platform; and
   contacting the edges of the work piece with a plurality of centrifugally activated work piece centering fingers.

22. the method of claim 21 further comprising the step of rotating the work piece platform at a first rotation speed and then at a second rotational speed higher than the first rotational speed.

23. The method of claim 21 wherein the step of positioning comprises robotically positioning a work piece on the plurality of frictional bumpers.

24. The method of claim 21 further comprising the step of sensing the presence of a work piece on the plurality of frictional bumpers.

* * * * *